United States Patent
Blanc et al.

(10) Patent No.: US 8,873,209 B2
(45) Date of Patent: Oct. 28, 2014

(54) INTEGRATED CIRCUIT AND METHOD OF PROVIDING ELECTROSTATIC DISCHARGE PROTECTION WITHIN SUCH AN INTEGRATED CIRCUIT

(75) Inventors: Fabrice Blanc, Vinay (FR); Matthieu Pauly, Grenoble (FR); Flora Pottier, St Georges de Commiers (FR)

(73) Assignee: ARM Limited, Cambridge (GB)

( * ) Notice: Subject to any disclaimer, the term of this patent is extended or adjusted under 35 U.S.C. 154(b) by 367 days.

(21) Appl. No.: 13/329,661

(22) Filed: Dec. 19, 2011

(65) Prior Publication Data

US 2013/0155555 A1 Jun. 20, 2013

(51) Int. Cl.
*H01L 23/528* (2006.01)
*H01L 27/02* (2006.01)

(52) U.S. Cl.
USPC .............................................. 361/56; 257/365

(58) Field of Classification Search
CPC ............ H01L 23/5286; H01L 27/0266; H01L 27/0255; H01L 27/0251
USPC ............................................ 361/56; 257/355
See application file for complete search history.

(56) References Cited

U.S. PATENT DOCUMENTS

| | | | | |
|---|---|---|---|---|
| 6,110,222 | A * | 8/2000 | Minami et al. | 716/113 |
| 6,395,586 | B1 * | 5/2002 | Huang et al. | 438/149 |
| 7,417,328 | B2 * | 8/2008 | Li et al. | 257/786 |
| 7,420,789 | B2 * | 9/2008 | Chen | 361/56 |
| 7,649,214 | B2 * | 1/2010 | Chen | 257/173 |
| 8,218,277 | B2 * | 7/2012 | Li et al. | 361/56 |
| 8,247,845 | B2 * | 8/2012 | Schroeder et al. | 257/203 |
| 8,293,578 | B2 * | 10/2012 | Bartley et al. | 438/109 |
| 8,645,895 | B2 * | 2/2014 | Bergmann et al. | 716/136 |

OTHER PUBLICATIONS

J. Miller et al., "Comprehensive ESD Protection for Flip-Chip Products in a Dual Gate Oxide 65nm CMOS Technology", Freescale Semiconductor Inc., EOS/ESD Symposium 06-186, pp. 4A.4-1-4A.4-10.

P. Juliano et al., ESD Protection Design Challenges for a High Pin-Count Alpha Microprocessor in a 0.13 μm CMOS SOI Technology, Alpha Development Group, Hewlett-Packard Corporation, 2003 EOS/ESD Symposium, 2003 ESD Association, 11 pages.

* cited by examiner

*Primary Examiner* — Zeev V Kitov
(74) *Attorney, Agent, or Firm* — Nixon & Vanderhye P.C.

(57) ABSTRACT

An integrated circuit (IC) with electrostatic discharge (ESD) protection includes functional circuitry for performing processing functions required by the IC, and interface circuitry for providing an interface between the functional circuitry and components external to the IC. The IC is formed of a plurality of layers, including component level layers, power grid layers, and intervening layers between the power grid layers and the component level layers providing interconnections between the functional components. The functional circuitry further includes at least one ESD protection circuit constructed so as to reside solely within the component level layers in order to provide ESD protection for an associated one or more of the functional components. Such an approach enables the required ESD protection to be provided locally within the functional circuitry, whilst retaining flexibility with regard to the placement of, and routing between, the various functional components of the functional circuitry.

16 Claims, 16 Drawing Sheets

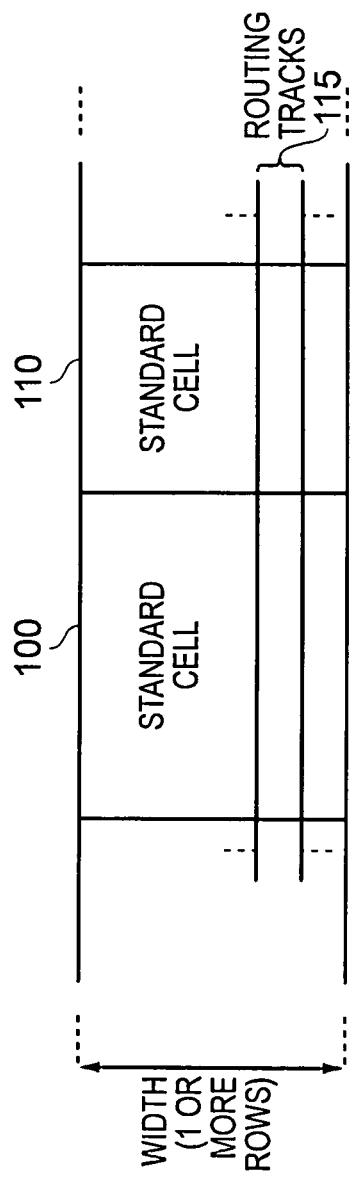
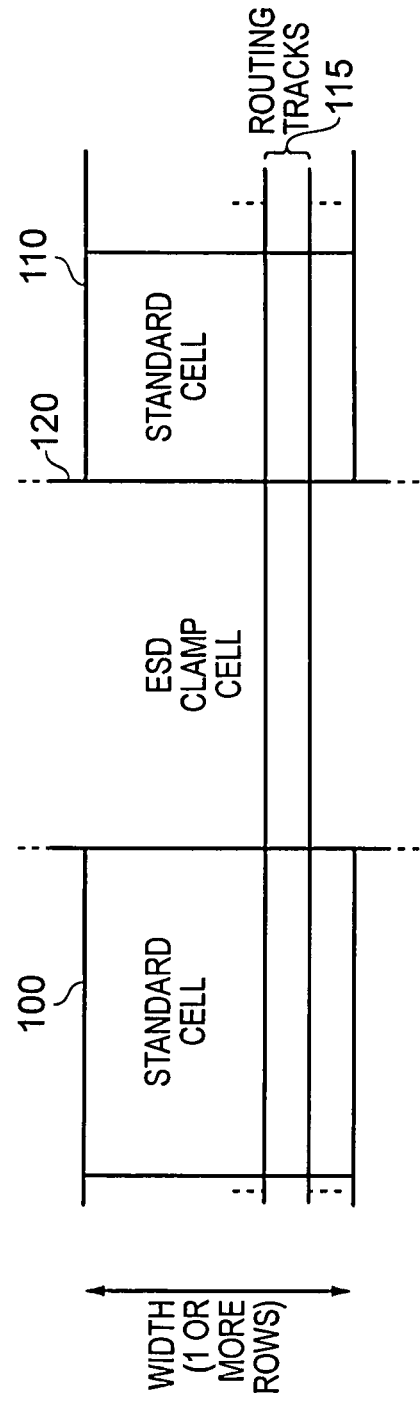

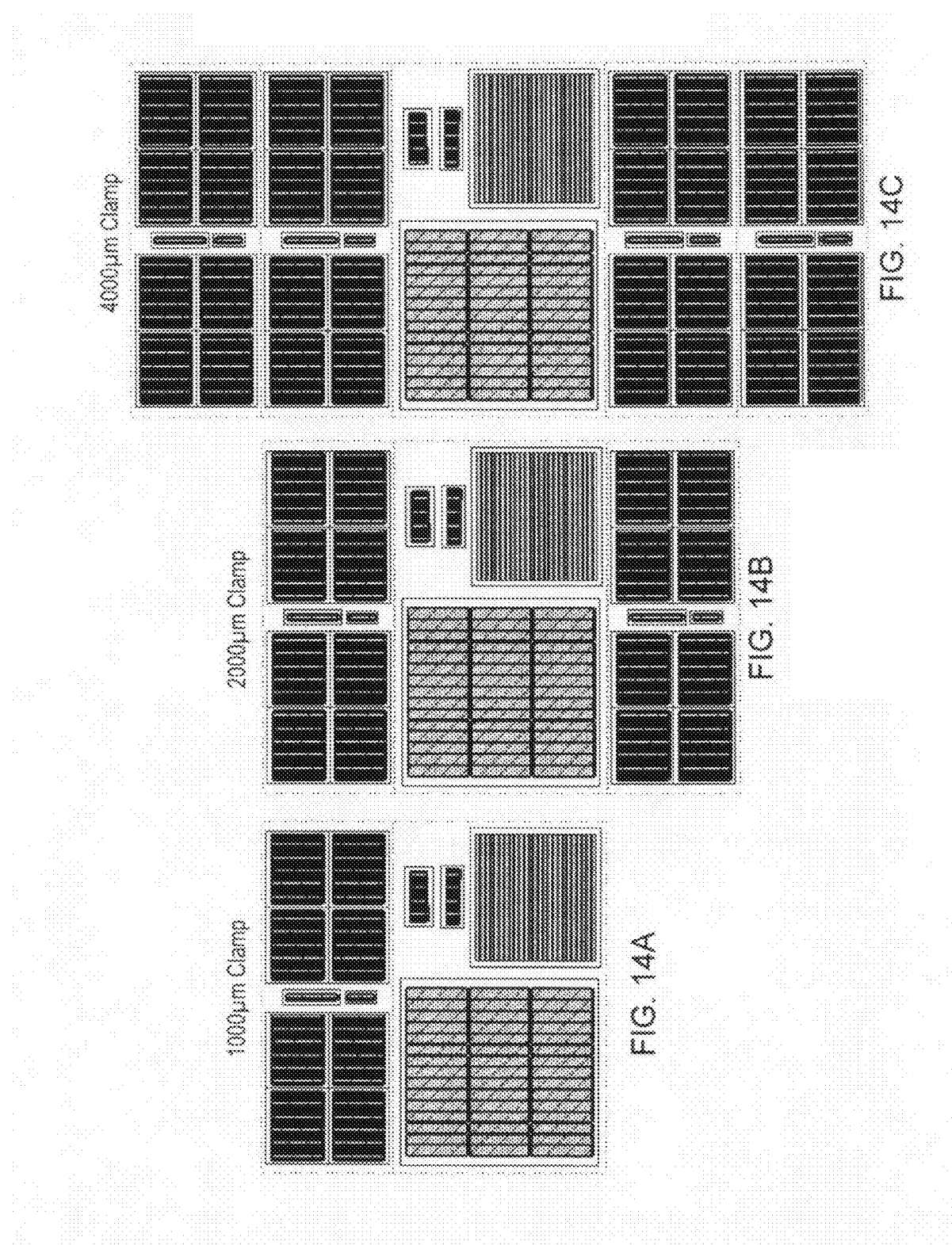

INTEGRATED CIRCUIT AND METHOD OF PROVIDING ELECTROSTATIC DISCHARGE PROTECTION WITHIN SUCH AN INTEGRATED CIRCUIT

BACKGROUND OF THE INVENTION

1. Field of the Invention

The present invention relates to an integrated circuit provided with electrostatic discharge (ESD) protection circuitry, and to a method of providing ESD protection within such an integrated circuit.

2. Description of the Prior Art

Typically an integrated circuit will comprise the functional circuitry needed to perform the processing functions of the integrated circuit, along with interface circuitry (often referred to as input/output (I/O) circuitry) for providing an interface between the functional circuitry and components external to the integrated circuit. Often the interface circuitry takes the form of an I/O ring surrounding the functional circuitry and incorporating all of the required I/O cells to facilitate the input/output requirements of the integrated circuit.

An integrated circuit can be subjected to various ESD sources, and it is necessary to protect the functional circuitry from those ESD sources. Typically, this is achieved by incorporating ESD protection circuits within the relevant I/O cells of the I/O ring.

As integrated circuits increase in size and complexity, and incorporate functionalities such as multiple power domains, this can give rise to significant challenges when designing the associated I/O ring. In particular, as the I/O count increases, then this gives rise to significant space constraints within the I/O ring, leading to the requirement for more and more space efficient designs for the various I/O cells, including the I/O cells incorporating ESD protection circuits. With the additional complication of multiple power domains, it is also necessary to provide suitable ESD protection for all of the various power domains.

Advancements in integrated circuit implementation techniques also provide further challenges for ESD protection mechanisms. For example, flip-chip assembly techniques for integrated circuits provide an array of bump connection points allowing external connections to be established at various places within the chip, and not restricted to the I/O ring. Whilst such a flip-chip assembly can provide improved flexibility, for example in the establishment of multiple power domains by allowing power connections to be made to appropriate bump connection points, it complicates the issue of providing suitable ESD protection for the various power domains, due to the routing required to the ESD protection circuits within the I/O ring.

The article "Comprehensive ESD Protection for Flip-Chip Products in a Dual Gate Oxide 65 nm CMOS Technology" by J Miller et al, EOS/ESD Symposium 06/186, 4A, 4-1 to 4-10, describes a modular ESD rail clamp network configuration for use in flip-chip products. In accordance with the described technique, all required ESD elements for an output VDD (OVDD) segment are wholly contained within the I/O cells for that segment, without the need for power/ground or spacer cells. Whilst such an approach can enable space savings to be achieved within the I/O ring due to the more efficient design, a significant issue that still arises is how to efficiently couple groups of functional components within the functional circuitry (for example a group of functional components associated with a particular power domain) with the ESD protection elements provided within the I/O ring. In particular, if the group of functional components lies relatively distant from the I/O ring (for example towards a central region of the integrated circuit), then it can be very difficult, and infeasible in certain situations, to find appropriate routing paths between the components and the associated ESD protection elements within the I/O ring. Even when routing can be found, if that routing is relatively long, there will be additional resistance in the path between the functional components and the ESD protection circuitry, which can lead to an increase in the size of the ESD clamp required, thereby increasing the space requirements for the ESD protection circuitry within the I/O ring.

The article "ESD Protection Design Challenges for a High Pin-Count Alpha Microprocessor in a 0.13 µm CMOS SOI Technology" by P Juliano et al, EOS/ESD Symposium Proceedings 2003, describes an integrated circuit arrangement where the floor plan is modified so as to incorporate a number of separate I/O blocks within the area of the integrated circuit, rather than using a traditional I/O ring. Whilst the use of such distributed I/O blocks can alleviate some of the earlier-mentioned routing problems by allowing the ESD protection circuitry within the relevant I/O cells to be located physically closer to the relevant functional components, it significantly reduces flexibility when compared with an I/O ring, due to the placement of the various I/O blocks having to be fixed at the floor planning stage. The use of such I/O cells without an I/O ring also impacts flexibility, since there is then a requirement to use a flip-chip implementation, preventing any wirebond packaging possibility. In addition, when considering the various layers that are used to implement an integrated circuit on a substrate, I/O cells are typically very "high", occupying virtually all of the layers constituting the integrated circuit. For example, considering the earlier-described flip-chip implementation, the I/O cells will typically extend through all of the layers from the silicon substrate up to the redistribution (RDL) layer. Hence, wherever the I/O blocks are placed, they provide an effective bather between functional components residing on one side and functional components residing on the other, this hence placing very significant constraints on the integrated circuit design.

Accordingly, it would be desirable to provide an improved ESD protection arrangement for an integrated circuit.

SUMMARY OF THE INVENTION

Viewed from a first aspect, the present invention provides an integrated circuit comprising: functional circuitry comprising functional components configured to perform processing functions required by the integrated circuit; and interface circuitry configured to provide an interface between the functional circuitry and components external to the integrated circuit; the integrated circuit being formed of a plurality of layers, said plurality of layers comprising component level layers within which any of said functional components formed from a standard cell are constructed, power grid layers providing a power distribution infrastructure for the functional components, and intervening layers between the power grid layers and the component level layers providing interconnections between the functional components; the functional circuitry further comprising at least one electrostatic discharge (ESD) protection circuit constructed so as to reside solely within the component level layers to provide ESD protection for an associated one or more of said functional components.

In accordance with the present invention, the integrated circuit includes at least one ESD protection circuit that is not provided within the interface circuitry, but instead is constructed so as to reside solely within the functional circuitry, thereby allowing it to be placed locally to the functional components for which it is providing ESD protection. In addition, that ESD protection circuit is constructed so as not to extend beyond the component level layers of the integrated circuit, and accordingly the ESD protection circuit has a height profile similar to any of the functional components formed from a standard cell. Since the ESD protection circuit does not extend into the layers above the component level layers, it allows the necessary ESD protection mechanism to be provided locally to the associated functional components without placing any significant constraints on the layout of the functional components of the functional circuitry, other than in respect of the required area consumption for the ESD protection circuit within the component level layers. In particular, a place and route tool used to position and interconnect the various functional components during the layout phase of the integrated circuit design retains a great deal of flexibility with regard to the placement of functional components, and with regard to the routing between those functional components using the intervening layers, even when one or more of the above-described ESD protection circuits are provided within the functional circuitry.

Whilst the ESD protection circuit of the present invention already provides significant routing flexibility due to it being constrained so as to reside solely within the component level layers of the integrated circuit, in one embodiment further routing flexibility can be achieved by arranging each ESD protection circuit to provide at least one communication channel passing through the ESD protection circuit that is not used by the ESD protection circuit, each communication channel providing a communication path between first and second functional components separated by that ESD protection circuit. Hence, in such embodiments, communications between functional components separated by the ESD protection circuit cannot only be achieved by connection paths running in the layers overlying the component level layers, but indeed one or more communication paths can be established through the ESD protection circuit within the component level layers themselves, due to the presence of said at least one communication channel.

The communication channels can be provided in a variety of ways. However, in one embodiment, the first and second functional components are located within at least one row, and each communication channel is provided by at least one routing track running along that at least one row and passing through the ESD protection circuit. Hence, in such embodiments, the design of the ESD protection circuit is such that one or more routing tracks pass directly through the ESD protection circuit without being connected to any of the components of the ESD protection circuit, thereby providing a communication path between functional components provided either side of the ESD protection circuit.

The component level layers can be formed in a variety of ways. However, in one particular embodiment, the component level layers are provided on a substrate, and include a metal 2 (M2) layer forming a top layer of the component level layers most remote from the substrate. Hence, in such embodiments, the ESD protection circuit provided within the functional circuitry is constrained so as to not extend beyond the metal 2 layer.

Considering now the area occupied by the ESD protection circuit, as opposed to its height, the ESD protection circuit can be arranged in a variety of ways. However, in one embodiment, the functional components are arranged in a plurality of rows, each row having a width (also referred to as a row height) determined by a standard cell pitch, and each ESD protection circuit being constructed so as to occupy an integer number of said rows. By constraining the ESD protection circuits so as to occupy an integer number of rows, this allows easy integration of the ESD protection circuit within the functional circuitry without introducing any additional area losses (over and above the area occupied by the components of the ESD protection circuit).

In one embodiment, the functional circuitry comprises at least one macrocell device formed from multiple of said functional components, the macrocell device extending beyond said component level layers into said intervening layers to provide required interconnections between the functional components of the macrocell. Such a macrocell will typically be powered by the power grid layers. The individual functional components of the macrocell may or may not be constructed from standard cells, but irrespective of whether the individual functional components of the macrocell are formed from standard cells, the overall height of the macrocell extends beyond the component level layers into the intervening layers, to allow for the various interconnections between the functional components of the macrocell to be accommodated. When compared with such a macrocell, it will be understood that the ESD protection circuit of embodiments provides significantly less constraints on the place and route tools, due to the ESD protection circuit's height being constrained to not extend beyond the component level layers, and in addition the ESD protection circuit optionally being provided with at least one communication channel passing through the ESD protection circuit within the component level layers.

The ESD protection circuit can be used in a variety of scenarios. In one embodiment, multiple power domains are provided within the integrated circuit and said at least one ESD protection circuit is configured to provide ESD protection to the associated one or more functional components within a particular power domain.

In one example implementation, the functional circuitry may include one or more ESD protection circuits as described above, and in addition the interface circuitry may provide one or more standard ESD protection elements (for example as components within I/O cells of an I/O ring). In one embodiment, the ESD protection for any particular power domain may be provided solely by one or more ESD protection circuits of the above described embodiments, solely by standard ESD protection elements within the interface circuitry, or by a combination of both types of ESD protection circuitry.

The integrated circuit can be formed in a variety of ways. However, in one embodiment the integrated circuit has a flip-chip implementation providing an array of bump connection points, and power supply for said particular power domain is provided through a number of said bump connection points in said array.

In one particular embodiment, those bump connection points used to provide the power supply for said particular power domain are in a region of the array remote from the interface circuitry. Hence, in such embodiments it is beneficial to use the ESD protection circuit of the above described embodiments, provided as part of the functional circuitry and constrained to reside solely within the component level layers, rather than seeking to use any standard ESD protection elements provided within the interface circuit (which would give rise to routing issues and/or exacerbate area constraints within the interface circuitry).

There are a number of mechanisms by which the ESD protection circuits of the above described embodiments may be inserted within the functional circuitry. However, in one embodiment, each such ESD protection circuit is inserted within the functional circuitry by a place and route tool during a layout phase of a design process for the integrated circuit. Dependent on the area occupied by such an ESD protection circuit, it may be possible in certain implementations to instantiate the ESD protection circuit as a standard cell, thereby further simplifying its incorporation within the functional circuitry as and when required during the layout phase of the design process.

Viewed from a second aspect, the present invention provides a method of providing electrostatic discharge protection for an integrated circuit having functional circuitry comprising functional components for performing the processing functions required by the integrated circuit, and interface circuitry for providing an interface between the functional circuitry and components external to the integrated circuit, the integrated circuit being formed of a plurality of layers, said plurality of layers comprising component level layers within which any of said functional components formed from a standard cell are constructed, power grid layers providing a power distribution infrastructure for the functional components, and intervening layers between the power grid layers and the component level layers providing interconnections between the functional components, the method comprising: determining the functional components required to perform the processing functions required by the integrated circuit; identifying groups of functional components requiring electrostatic discharge (ESD) protection; and for at least one of said identified groups, providing at least one ESD protection circuit within the functional circuitry in association with that group, each said at least one ESD protection circuit constructed so as to reside solely within the component level layers to provide ESD protection for that group.

In one particular embodiment, for each identified group the method further comprises applying predetermined criteria to determine whether to provide the ESD protection for that group using said at least one ESD protection circuit within the functional circuitry or using ESD protection elements within the interface circuitry. The predetermined criteria applied can take a variety of forms, but in one embodiment can take account of the location of the identified group within the integrated circuit, for example how remote it is from the interface circuitry.

Viewed from a third aspect, the present invention provides an integrated circuit comprising: functional circuitry means comprising functional component means for performing processing functions required by the integrated circuit; and interface circuitry means for providing an interface between the functional circuitry means and components external to the integrated circuit; the integrated circuit being formed of a plurality of layers, said plurality of layers comprising component level layers within which any of said functional component means formed from a standard cell are constructed, power grid layers for providing a power distribution infrastructure for the functional component means, and intervening layers between the power grid layers and the component level layers for providing interconnections between the functional component means; the functional circuitry means further comprising at least one electrostatic discharge (ESD) protection means residing solely within the component level layers for providing ESD protection for an associated one or more of said functional component means.

BRIEF DESCRIPTION OF THE DRAWINGS

The present invention will be described further, by way of example only, with reference to embodiments thereof as illustrated in the accompanying drawings, in which:

FIGS. 4A and 4B illustrate how an ESD clamp cell of one embodiment may be incorporated within the layout of the functional circuitry between two standard cells in accordance with one embodiment;

FIGS. 14A to 14C illustrate how various sizes of ESD protection clamp can be achieved using the layout of the circuitry of FIGS. 13A to 13C in accordance with one embodiment.

DESCRIPTION OF EMBODIMENTS

Figure 1:
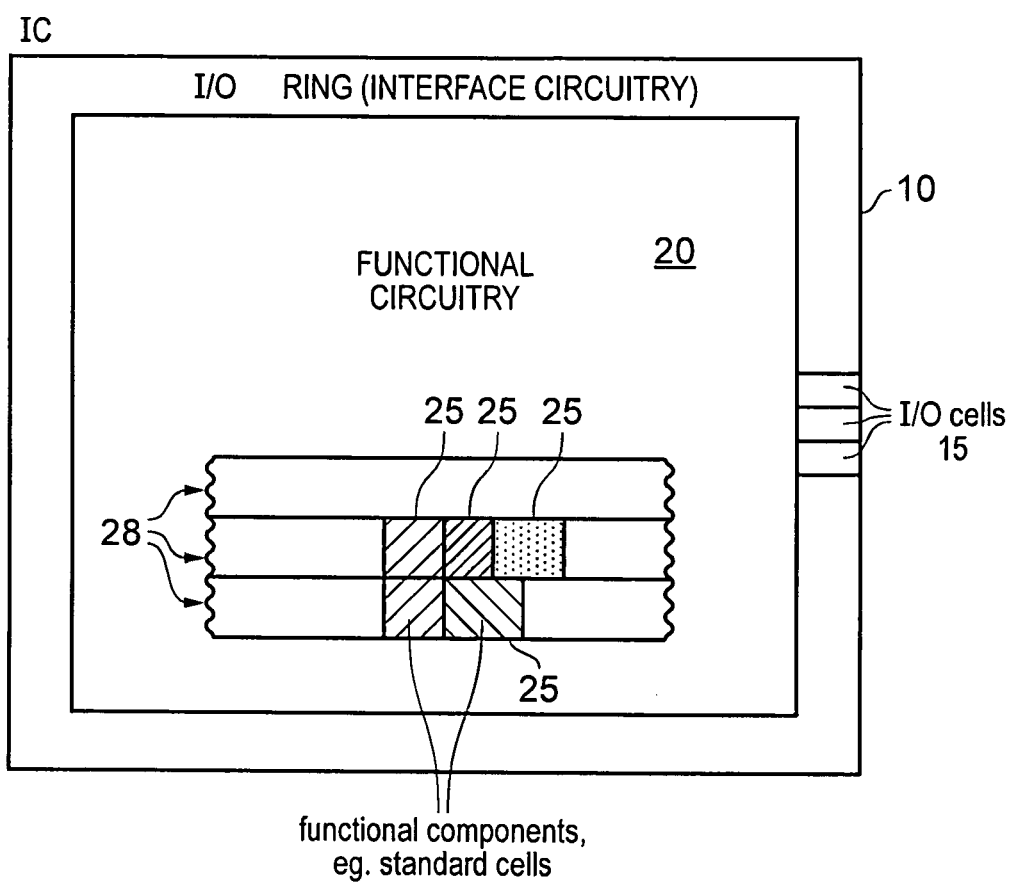
FIG. 1 is a diagram schematically illustrating an integrated circuit in which the technique of embodiments may be employed.

FIG. 1 schematically illustrates an integrated circuit in which the techniques of embodiments can be employed. As shown in FIG. 1, the integrated circuit includes functional circuitry 20 comprising a plurality of functional components 25 that are configured to perform the required processing functions of the integrated circuit. In the design of semiconductor integrated circuits, it is known to provide automated tools which use a functional design of a planned integrated circuit (for example in the form of a gate level netlist or a Register Transfer Language higher level representation of the design) and a cell library providing a set of standard cells (the standard cells defining the functional components, and being "building blocks" for putting together the layout of the integrated circuit according to the functional design) in order to generate the layout of an integrated circuit. In one embodiment, at least some of the functional components 25 of the functional circuitry 20 are formed from such standard cells.

Typically, the standard cells are arranged in rows 28 by the automated tool and (considered the rows as running horizontally) the left and right boundaries of each standard cell are such that any given standard cell may be placed next to any other given standard cell. Thus, the automated tool has free choice as to which standard cells are placed where in order to fulfill the requirements of the functional design with a low routing overhead. Some standard cells may be constrained to fit within a single row, whilst other standard cells may have a width that is an integer number of the row width (also referred to as the row height).

In the embodiment of FIG. 1, the functional circuitry 20 is surrounded by an I/O ring 10 forming interface circuitry for providing an interface between the functional circuitry and components external to the integrated circuit. Typically, the I/O ring consists of a plurality of I/O cells 15 for providing particular I/O connections.

Figure 2:
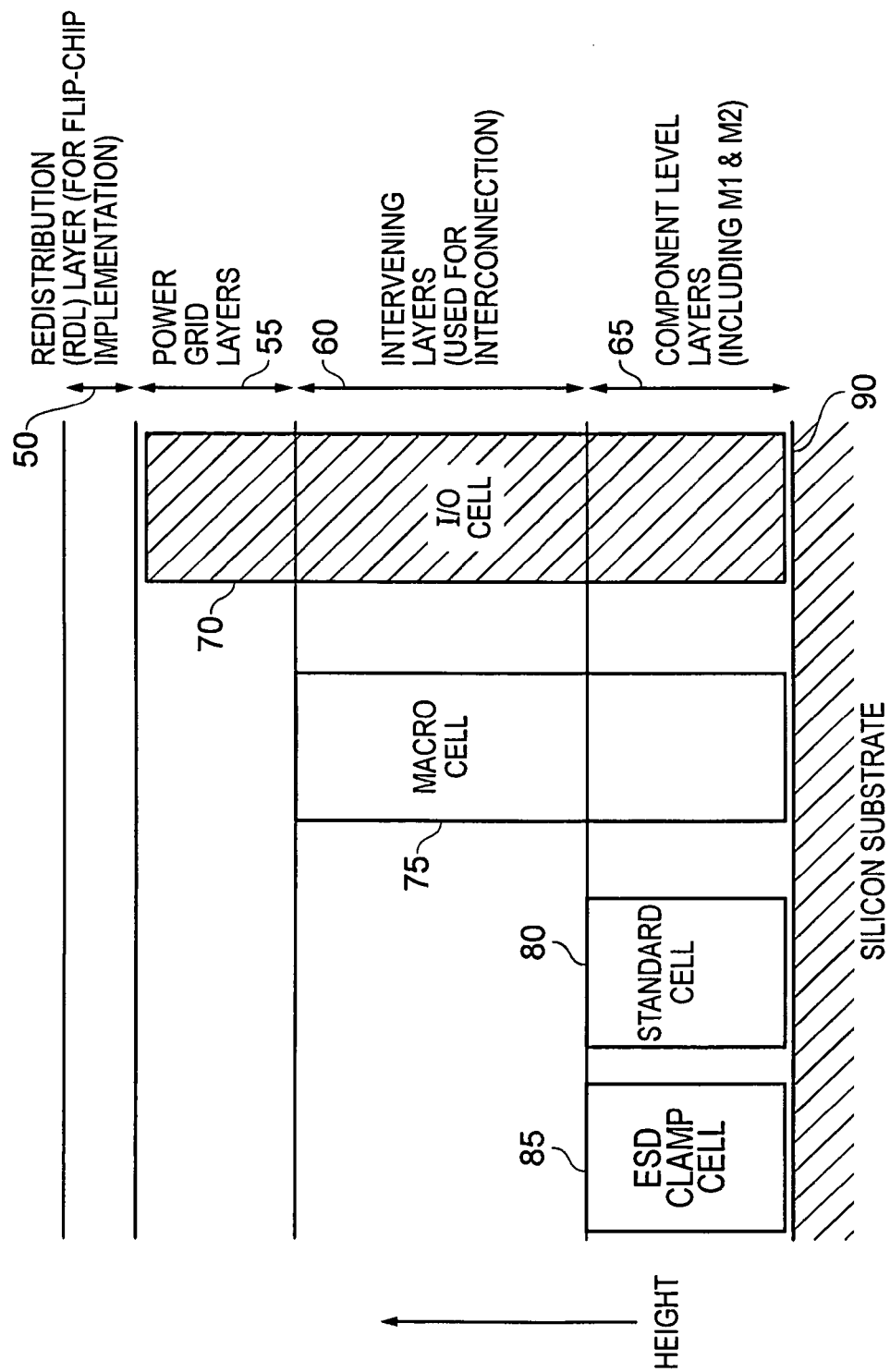
FIG. 2 is a diagram illustrating the height within the integrated circuit occupied by various types of cells, including the ESD clamp cell of one embodiment.

FIG. 2 illustrates various types of cells that may be provided within the integrated circuit, and gives an indication of their relative heights (i.e. perpendicular to the plan view shown in FIG. 1). As shown, the integrated circuit is formed of a plurality of layers established upon a silicon substrate 90. In particular, a first plurality of layers established over the silicon substrate 90 form the components level layers 65 in which individual functional components are formed. In particular, any functional components formed from a standard cell 80 will reside solely within these component level layers. Power grid layers 55 are also provided for establishing a power distribution infrastructure for the various functional components, and a number of intervening layers 60 are then provided between the power grid layers 55 and the component level layers 65 to provide interconnections between the functional components. These interconnections can take a variety of forms, for example direct point-to-point connections, bussing structures, etc. In some embodiments, these intervening layers may also be used to perform power biasing functions. In some implementations, there will also be one or more layers above the power grid layers 55. For example, considering a flip-chip implementation, a redistribution (RDL) layer 55 will be provided above the power grid layers 55.

As well as including individual functional components, the functional circuitry may also include one or more macrocells 75. A macrocell device is formed from multiple functional components, and as shown in FIG. 2 typically extends in the vertical direction beyond the component level layers into the intervening layers in order to accommodate the required connections between the functional components of the macrocell.

As shown in FIG. 2, the I/O cells 70 provided with the I/O ring occupy almost the entire vertical height of the integrated circuit, extending through the component level layers, the intervening layers and typically the power grid layers.

In accordance with the described embodiments, a novel ESD clamp cell 85 is provided which is constructed so as to reside solely within the functional circuitry, hence enabling it to be placed close to the functional components requiring ESD protection. Additionally, as shown in FIG. 2, it is constructed so as to reside solely within the component level layers 65, hence retaining flexibility in the intervening layers 60 for the establishment of connections between the various functional components.

Figure 3:
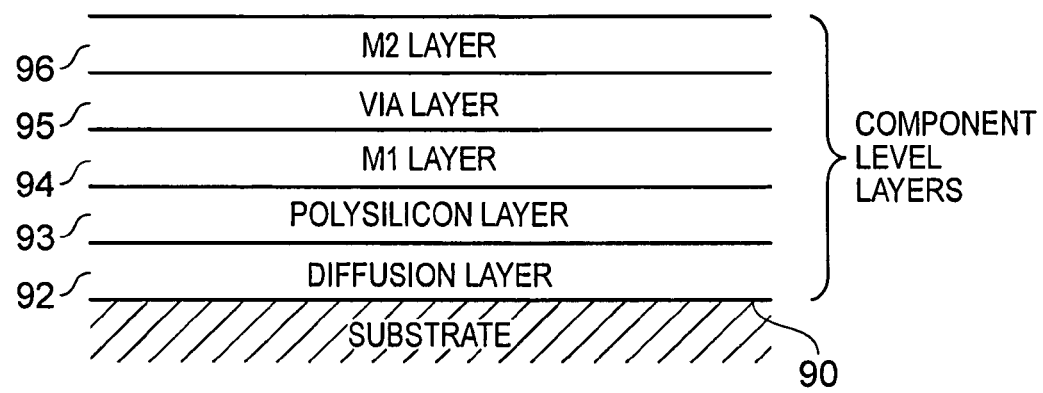
FIG. 3 schematically illustrates the layers forming the component level layers of FIG. 2 in accordance with one embodiment.

FIG. 3 illustrates the various layers forming the component level layers 65 in accordance with one embodiment. In particular, as shown, one or more diffusion layers 92 are provided in or on the substrate 90, over which a polysilicon layer 93 is provided. Above the polysilicon layer is a metal 1 layer 94, which is separated from a metal 2 layer 96 by a via layer 95. The metal 2 layer forms the top layer of the component level layers 65, and accordingly it can be seen that the ESD clamp cell 85 of the described embodiments is constrained not to extend beyond the metal 2 layer 96. This provides significant flexibility for the formation of such ESD clamp cells as and where required within the functional circuitry, without placing significant constraints on the place and route tools used during the layout phase of the design to provide and interconnect the required functional components needed to form the functional circuitry.

FIG. 4A illustrates two standard cells 100, 110 that may be placed side-by-side during and place and route process. In FIG. 4A, a plan view is presented rather than an elevation view, and each standard cell has a width equal to one or more rows. Routing tracks 115 extend along the rows and provide communication paths between the various standard cells placed along the row.

FIG. 4B illustrates how an ESD clamp cell in accordance with embodiments may be inserted between the two standard cells whilst allowing the routing tracks to continue to be used as a communication path between the standard cells in the row. In particular the ESD clamp cell 120 is configured such that it can be located between any two standard cells without interrupting the operation of those standard cells. Whilst the ESD clamp cell may have the same width as the standard cells adjacent to it, it can have a width that exceeds the width of those standard cells, as illustrated schematically in FIG. 4B. Typically however, the width will be set equal to an integer number of row widths so as to allow for the best integration in the place and route process without additional area losses (over and above the area required for the ESD clamp cell itself). One or more routing tracks 115 are arranged to pass through the ESD clamp cell 120 without being used by any components of the ESD clamp cell itself, hence providing at least one communication channel through the ESD clamp cell within the component level layers. As a result, the standard cells in a particular row can continue to communicate with each other via the routing tracks despite the presence of the ESD clamp cell 120. In addition, as will be apparent from the earlier-discussed FIG. 2, interconnections between standard cells can also be readily achieved within the intervening layers 60 due to the ESD clamp cell 120 being constrained so as to not extend beyond the component level layers 65.

Figure 5:
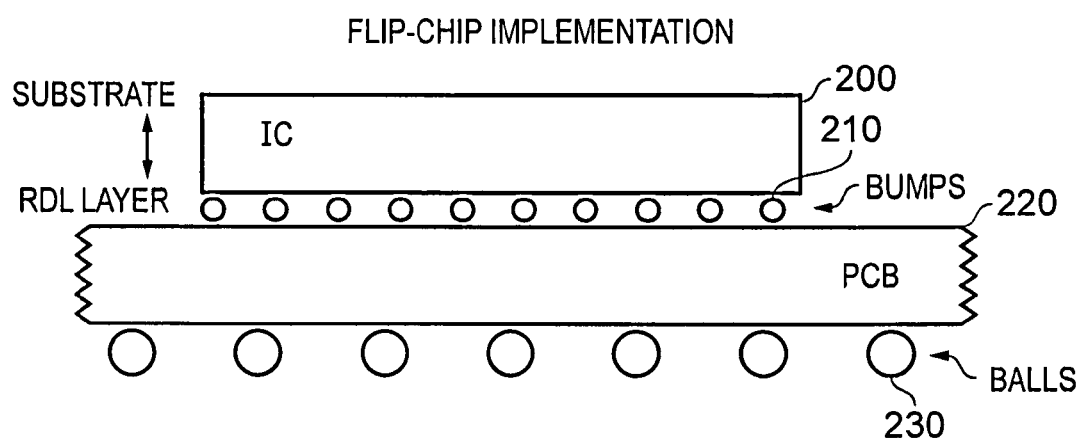
FIG. 5 schematically illustrates a flip-chip implementation in which the techniques of embodiments may be utilised.

FIG. 5 schematically illustrates a flip-chip implementation. In such an implementation, a printed circuit board (PCB) 220 is provided with a number of connection balls 230, and each integrated circuit provided on the PCB 220 is coupled to the PCB via a plurality of bumps 210. One such integrated circuit is shown by the integrated circuit 200 in FIG. 5. The integrated circuit is mounted onto the PCB in an inverted ("flipped") arrangement, such that the substrate is remote from the PCB, and the RDL layer provides the contact layer for the bumps 210 connecting the integrated circuit 200 with the PCB 220.

The bumps are formed as an array in both the x and y dimensions, providing a great deal of flexibility for connection of external signals to particular blocks of functional components within the integrated circuit 200. In particular, there is no need for all such signals to be routed onto the integrated circuit 200 via the I/O ring. However, traditionally, all ESD protection circuitry has been provided within the I/O ring and the use of the bump connections has been problematic in certain situations, for example where they are used to provide power supply connections to a block of components relatively remote from the I/O ring, due to the need to provide routing paths back to the I/O ring in order to provide the necessary ESD protection. Such routing paths can be difficult to establish, and even where they can be established they can give rise to significant resistive losses which need to be compensated for within any ESD structure provided within the I/O ring. This has to date placed certain restrictions on how the bumps 210 can in practice be used within any particular implementation.

Figure 6:
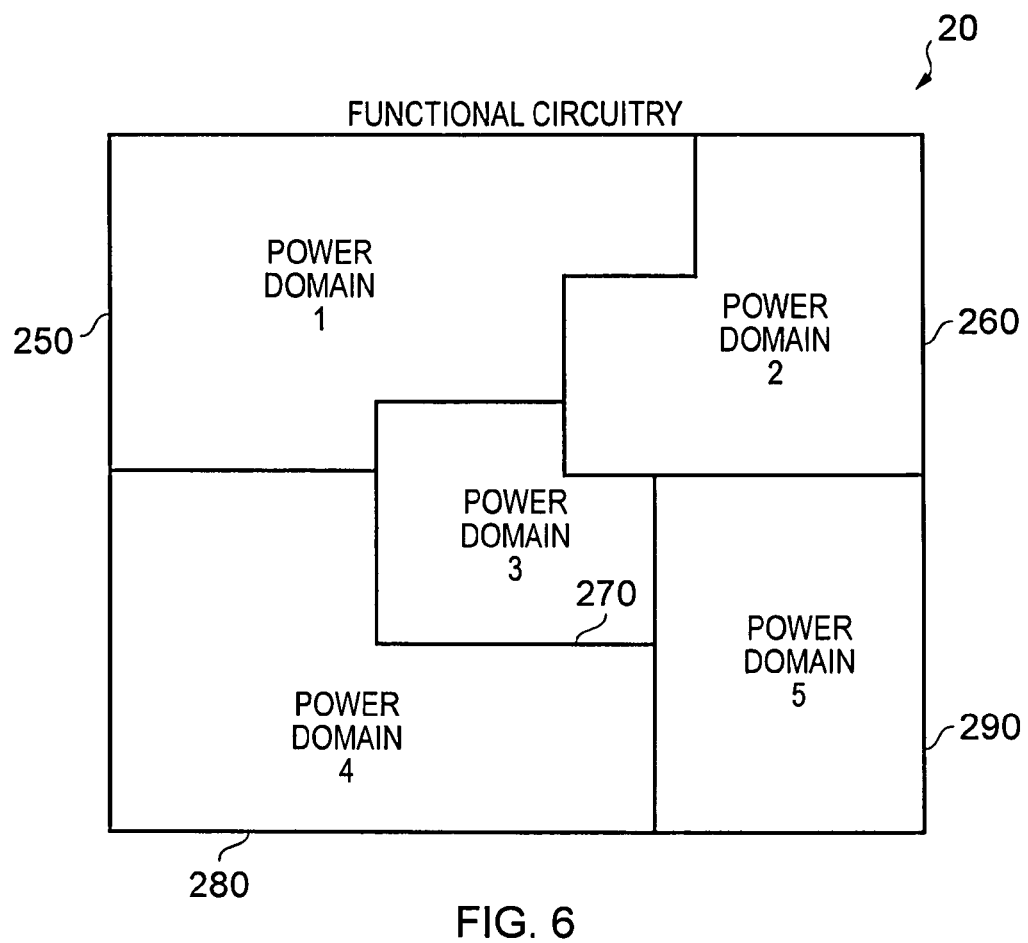
FIG. 6 schematically illustrates how various power domains may be established within the functional circuitry of FIG. 1 in accordance with one embodiment.

One application where it would be very useful to use the bumps 210 is in the area of multiple power domains. In particular, as shown in FIG. 6, the functional circuitry may be sectioned up so as to provide components existing in separate isolated power domains. In the example of FIG. 6, five power domains 250, 260, 270, 280 and 290 are shown. When the power domains are relatively close to the I/O ring, it is possible to use the bump connections 210 overlying those power domains to establish the necessary power supply contacts, whilst still using existing ESD clamp structures within the I/O rings to provide ESD protection. However, this can become particularly problematic when the power domain in question is not close to the I/O ring, such as for example illustrated by the power domain 270 in FIG. 6. In some instances, prior to use of the ESD clamp cell of the present invention, it would not have been possible to provide a separate isolated power supply for such a block of components since there would have been no clear path available to provide links back to the I/O ring for the necessary ESD protection. However, the use of the earlier described ESD clamp cells of embodiments, which reside solely within the functional circuitry and are constrained to reside only within the component level layers, enable such power domain segmentation to be readily achieved, whilst supporting the required ESD protection.

Figure 7A:
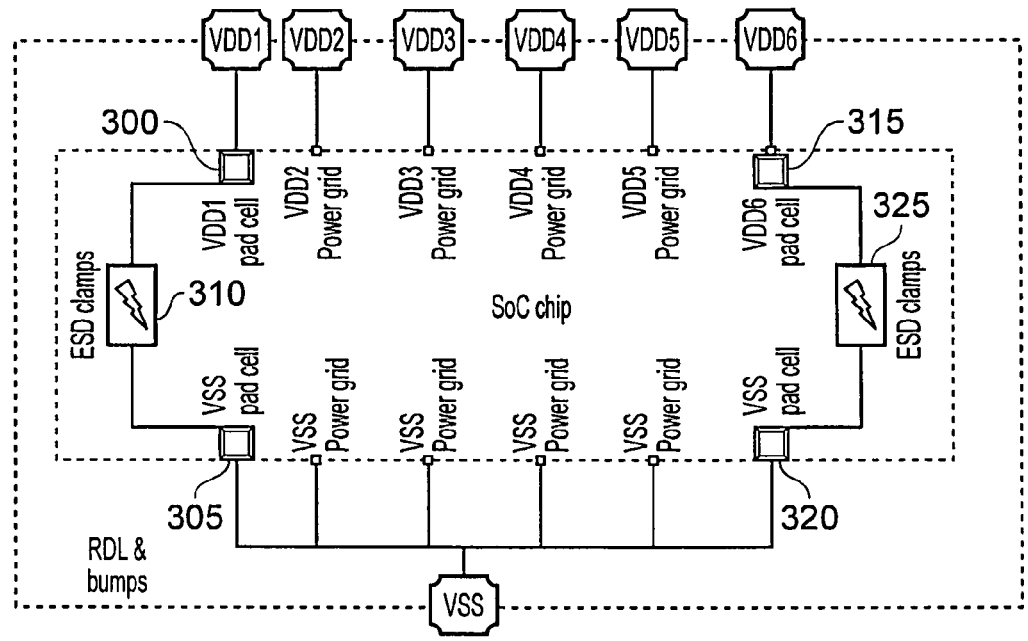
FIGS. 7A and 7B schematically illustrate how the ESD clamp cells of embodiments may be used to provide local ESD protection for various power domains within the integrated circuit in accordance with one embodiment.
Figure 7B:
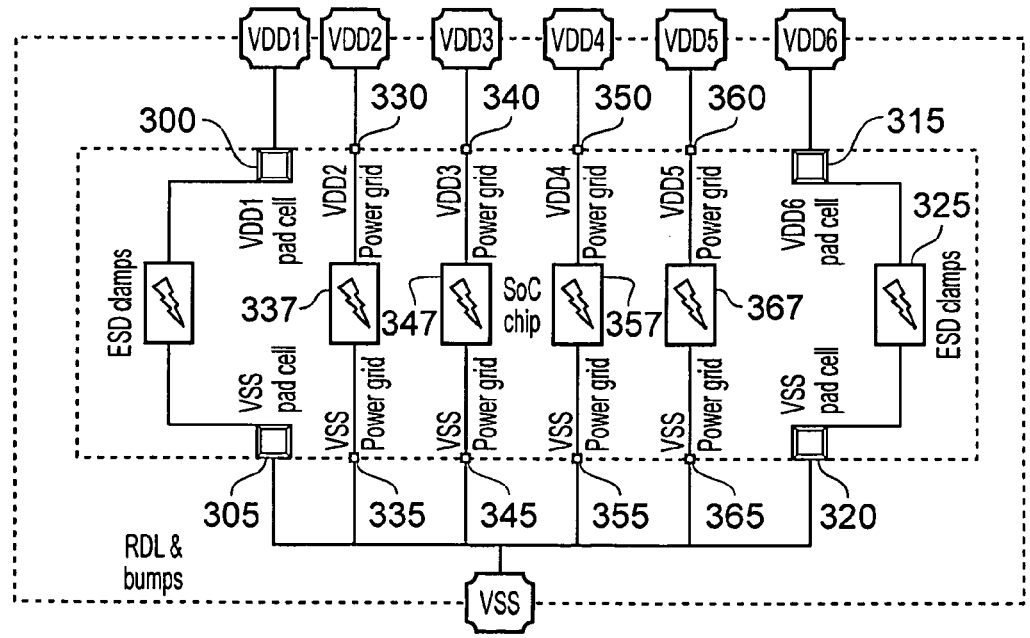

This is illustrated schematically with reference to FIGS. 7A and 7B. As illustrated schematically in FIG. 7A, the bump technology offers connection capabilities at many different places within the chip, but until now the necessary ESD protection structures could only be provided within I/O cells typically residing within an I/O ring at the periphery of the chip, and hence were not able to efficiently protect any isolated core power domains that would be directly and only connected to bumps in the middle of the chip (as for example illustrated schematically by the connections VDD 2 to VDD 5 in FIG. 7A). Hence, in this example, the existing ESD clamp structures 310, 325 within the I/O ring could only be used in association with power supply pads 300, 305, 315, 320 provided near the periphery of the integrated circuit (supporting the connections VDD1, VDD6 and VSS). Furthermore, even where suitable routing could be established from a particular power domain back to the I/O ring in order to incorporate the necessary ESD protection features, the resistance of those paths could lead to some extra voltage drop which reduces the efficiency of such ESD clamps within the I/O ring.

However, as shown in FIG. 7B, when using the ESD clamp cells of the described embodiments, a local solution to the ESD risk can be achieved without disturbing the standard cells placement via place and route tools (other than the area penalty of incorporating the ESD cells), due to the standard cell compatible layout of the clamp used in the described embodiments. Accordingly, in FIG. 7B, the ESD clamps 337, 347, 357, 367 represent ESD clamps of the described embodiments, residing entirely within the functional circuitry, and constrained to reside solely within the component level layers. Such ESD clamps can be readily incorporated into the design, and provide an efficient solution for implementing ESD protection.

Figure 8:
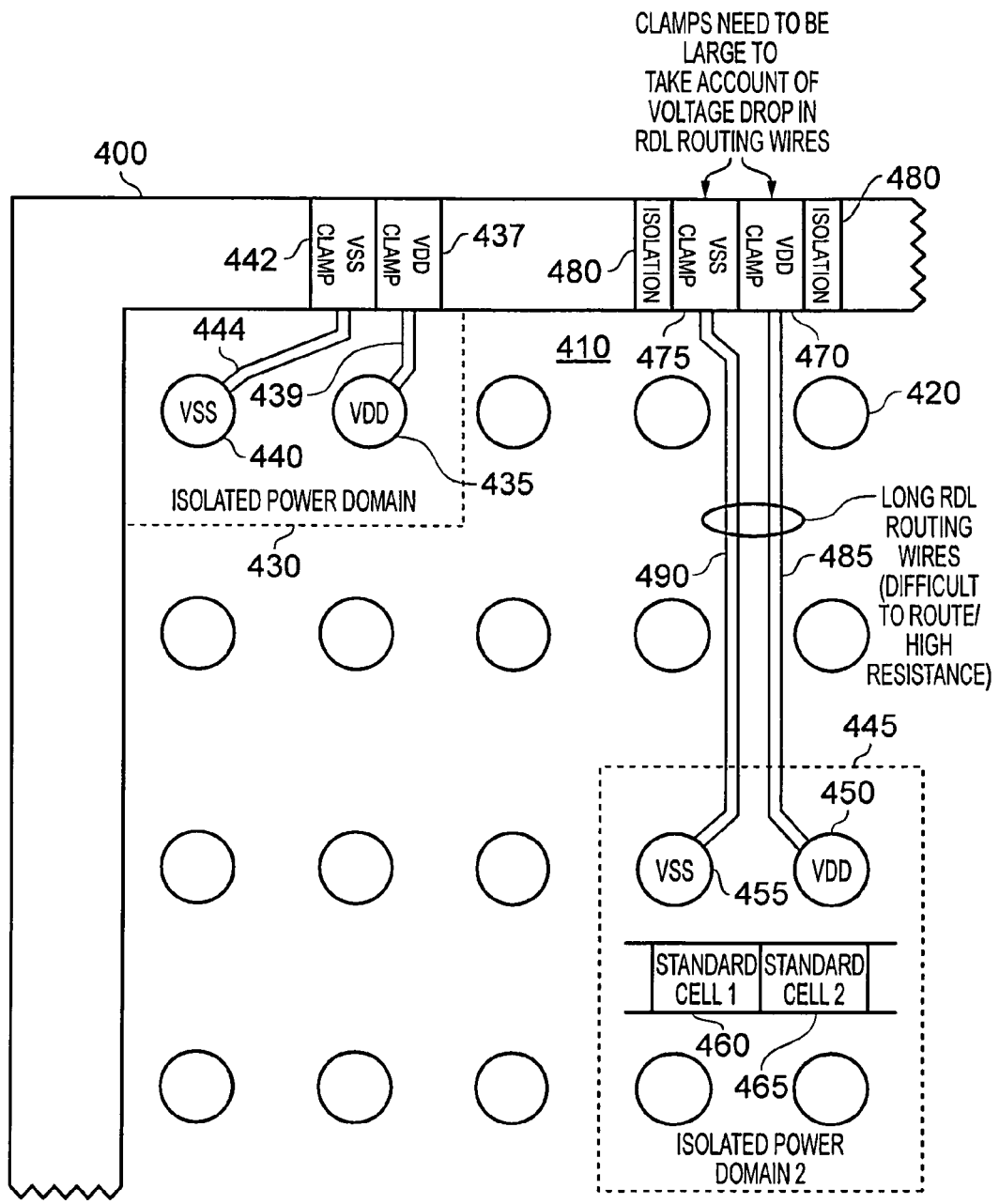
FIG. 8 illustrates the problems that can arise from seeking to provide ESD protection using cells of an I/O ring within a flip-chip implementation of an integrated circuit.

FIG. 8 schematically illustrates the problems that can arise with respect to isolated power domains when seeking to use ESD clamp structures within the I/O ring. In particular, FIG. 8 shows a plan view looking down on the RDL layer of the chip, within an array of bump connections 420 provided on top. The I/O ring 400 is also shown around the edge of the functional circuitry 410. For the isolated power domain 430 that resides close to the I/O ring, VDD and VSS connections can be provided by the bump connections 435, 440, whilst readily providing RDL connections paths 439, 444 to associated ESD clamp structures 437, 442 within the I/O ring 400. However, for the isolated power domain 445 which is more remote from the I/O ring 400, the provision of the necessary RDL routing tracks 485, 490 to associated ESD clamp structure 470, 475 within the I/O ring can be significantly more problematic, due to issues such as electromigration, series resistance and ESD current capability limits dictating a certain minimum RDL track width, and the size of the bumps dictating a certain pitch. Indeed, within current technology constraints, it has been found that when more than four or five rows of bump connections are traversed, it is often infeasible, or at least inefficient, to find appropriate routing for such RDL tracks. Where the routing tracks can be established, their relatively high resistance (due to their length) can require the corresponding ESD clamp structures 470, 475 within the I/O ring to be made relatively large. It is sometimes also then necessary to provide isolation structures 480 either side of the ESD clamp structures 470, 475, thus exacerbating the space constraint problem within the I/O ring.

Figure 9:
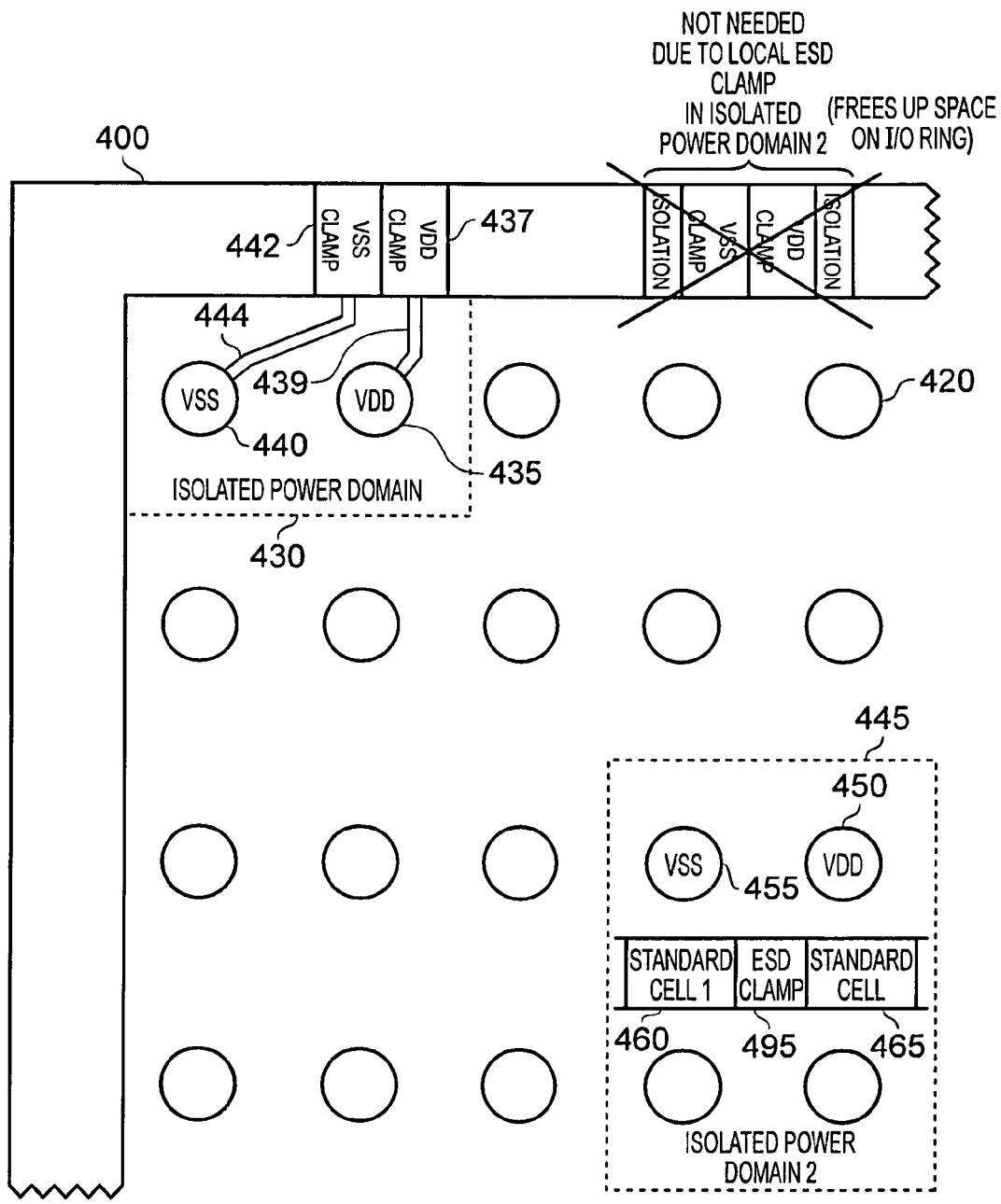
FIG. 9 illustrates how the problems discussed with reference to FIG. 8 can be addressed when using an ESD clamp cell in accordance with embodiments.

FIG. 9 illustrates the same isolated power domain structures, but indicates how an ESD clamp 495 in accordance with the described embodiments can be arranged between relevant standard cells 460, 465 within one or more rows of components within the isolated power domain 445, in order to locally provide the required ESD protection, avoiding the need for RDL routing wires to be provided from the VDD and VSS bump connections 450, 455 to the I/O ring. Hence, the ESD clamp structures that would otherwise be required are no longer needed within the I/O ring, hence freeing up space on the I/O ring for other I/O cells.

Figure 10:
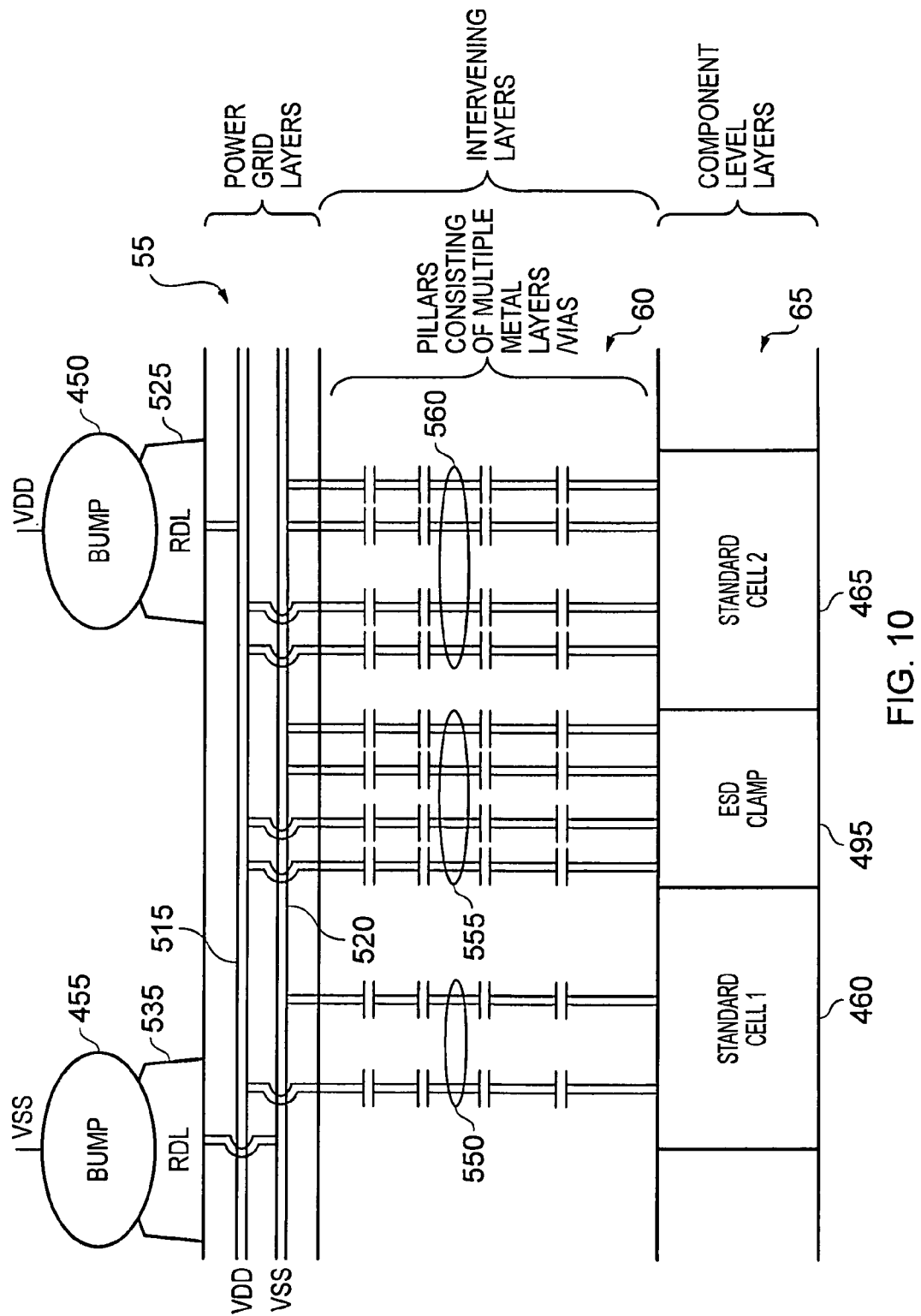
FIG. 10 illustrates how connections can be established between various components in the component level layers (including the ESD clamp of embodiments) and power supplies provided via bump connection points in accordance with one embodiment.

FIG. 10 schematically illustrates how the two standard cells 460, 465 and intervening ESD clamp cell 495 of FIG. 9 can be connected to the VDD and VSS bump connections 450, 455 of FIG. 9 in accordance with one embodiment. The bump connections 450, 455 are mounted on RDL pads 525, 535, respectively, which are then connected into corresponding VDD and VSS power lines 515, 520 within the power grid layers 55. Each of the standard cells 460, 465 and ESD clamp cell 495 have associated pillars 550, 560, 555, respectively, provided through the intervening layers to establish power supply and ground connections for those cells, as well as to provide for signal bussing between cells. As shown schematically in FIG. 10, each of the pillars consists of multiple metal layers and intervening via connections. In one embodiment, each cell's functionality and its corresponding drive strength and power consumption are taken into account when determining how the associated pillars are to be sized in order to match reliability constraints and IR drop constraints. Place and route tools can be arranged to use constraint files to determine such pillar sizing. As a result, some standard cells, such as the standard cell 460, may only need a single pillar for the power supply line and a single pillar for the ground line, whilst other standard cells, such as the standard cell 465, may require multiple power supply and ground pillars, for example to address ageing concerns resulting from electromigration. The ESD clamp cell 495 will also typically have multiple power supply and ground pillars, but in this case they are provided to deal with the relatively high currents that may pass through the ESD clamp cell, and serve to limit the IR drop, self heating or even degradation due to ESD.

Figure 11:
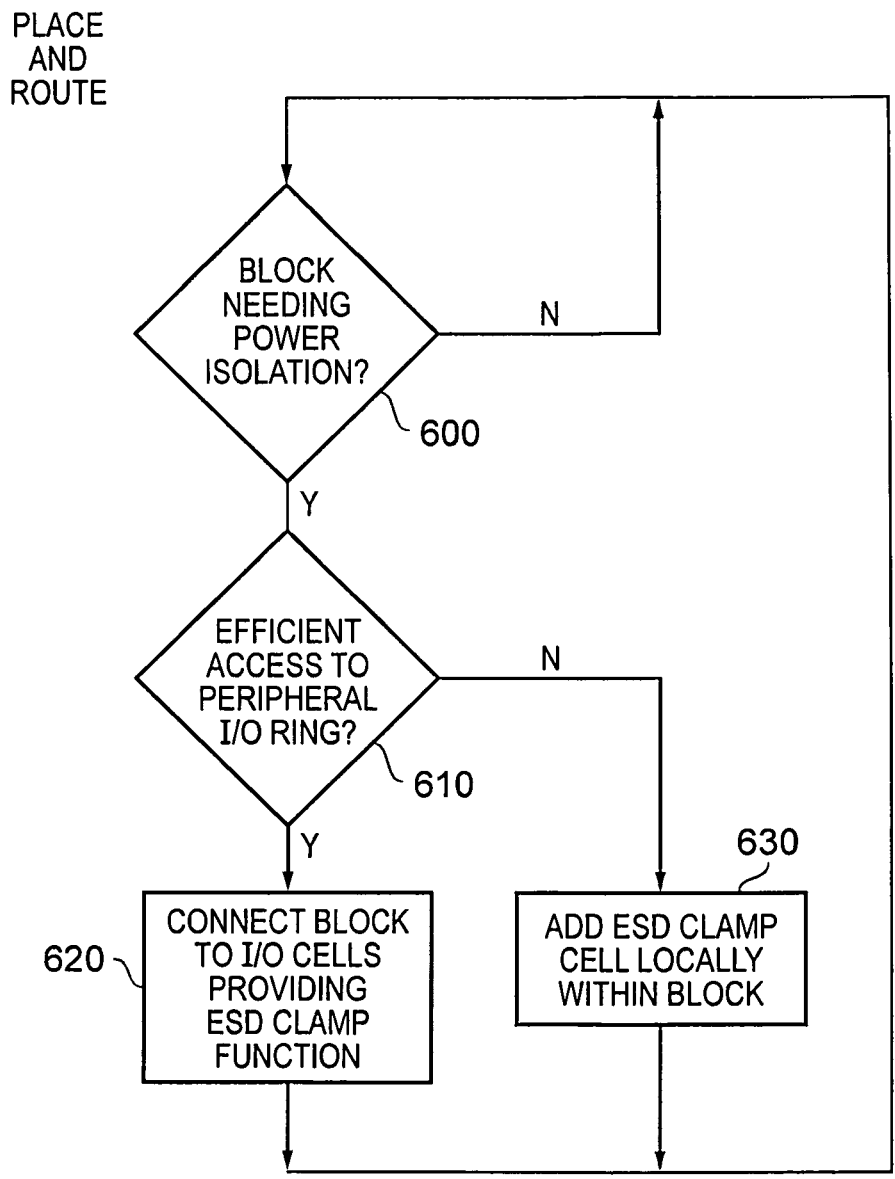
FIG. 11 is a flow diagram illustrating decisions that can be taken during the place and route process in accordance with one embodiment in order to determine how to provide ESD protection for particular blocks of functional components.

FIG. 11 is a flow diagram illustrating how a choice can be made between local ESD clamp structures provided within the functional circuitry, and standard ESD clamp structures provided within the I/O ring, when performing place and route operations. At step 600, it is determined whether there is a block of functional components that need power isolation. The power isolation may be for power management reasons, but alternatively may be provided for other reasons, for example noise isolation. Whenever it is decided that there is a block that needs power isolation, the process proceeds to step 610, where it is determined whether efficient access can be provided to the peripheral I/O ring. If it can, then the standard mechanism of connecting the block to I/O cells that provide the ESD clamp function may be performed at step 620. However, if efficient access to the peripheral I/O ring is not available, then (as shown at step 630) one or more ESD clamp cells in accordance with the described embodiments may be provided locally within the functional block itself in order to provide the required ESD protection.

Figure 12A:
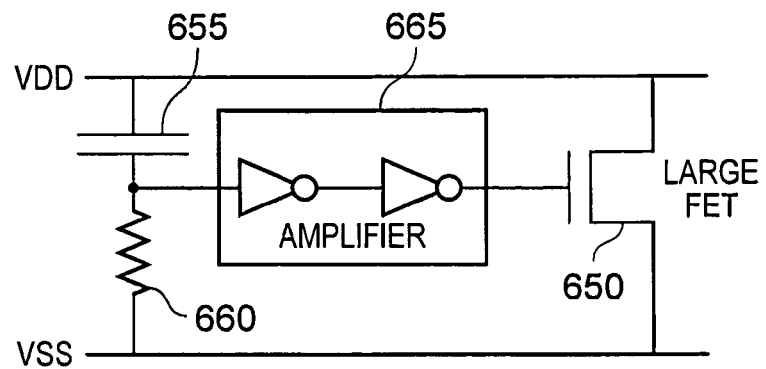
FIGS. 12A to 12C illustrate various forms of circuitry that can be used to form the ESD protection circuitry of embodiments.
Figure 12B:
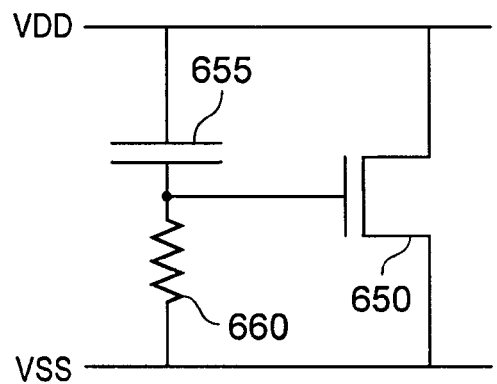
Figure 12C:
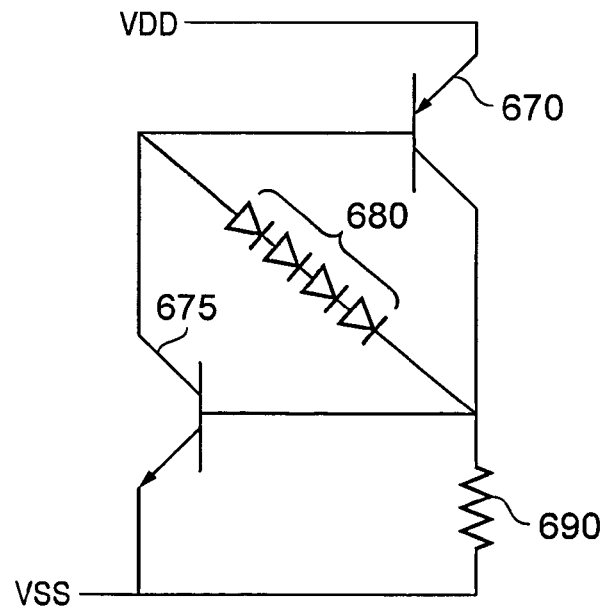

FIGS. 12A to 12C illustrates various examples of structures that can be used to provide the ESD clamp cell of described embodiments. As shown in the example of FIG. 12A, a capacitor 655 in series with a resistor 660 can be used to provide an input to an amplifier circuit 665 consisting of a series of inverters (in this example two inverters). The output of the amplifier circuit is then provided to the gate of a field effect transistor (FET) 650. In this embodiment, the FET can be made relatively large, and hence can cope with a significant current that may need to be dissipated when performing the ESD protection function. Whilst such a circuit operates well, it will typically be relatively large, and hence will occupy multiple rows within the functional circuitry.

The circuitry of FIG. 12B performs basically the same function, but does not include the amplifier circuitry 665 and fully relies on the MOSFET parasitic bipolar NPN conduction. Whilst this circuit can be made smaller, it may be necessary to provide multiple and distributed instances of the circuit in order to provide the required clamping voltage level for effective ESD protection, due to the higher triggering voltage of this FET structure and the reduced budget for its ON resistivity.

FIG. 12C illustrates another example embodiment of ESD clamp using a pair of bipolar junction transistors 670, 675, the transistor 670 being a PNP transistor and the transistor 675 being an NPN transistor (such a structure often being referred to as a thyristor, a Silicon Controlled Rectifier (SCR), or (with the series of diodes 680) a Diode Triggered SCR (DTSCR)). The series of diodes 680 are connected between the base of the transistor 670 and the base of the transistor 675, whilst a resistor 690 is connected between the base of the transistor 675 and ground. Such an embodiment can provide a suitable ESD clamp having a relatively small size for its current carrying capacity.

Figure 13A:
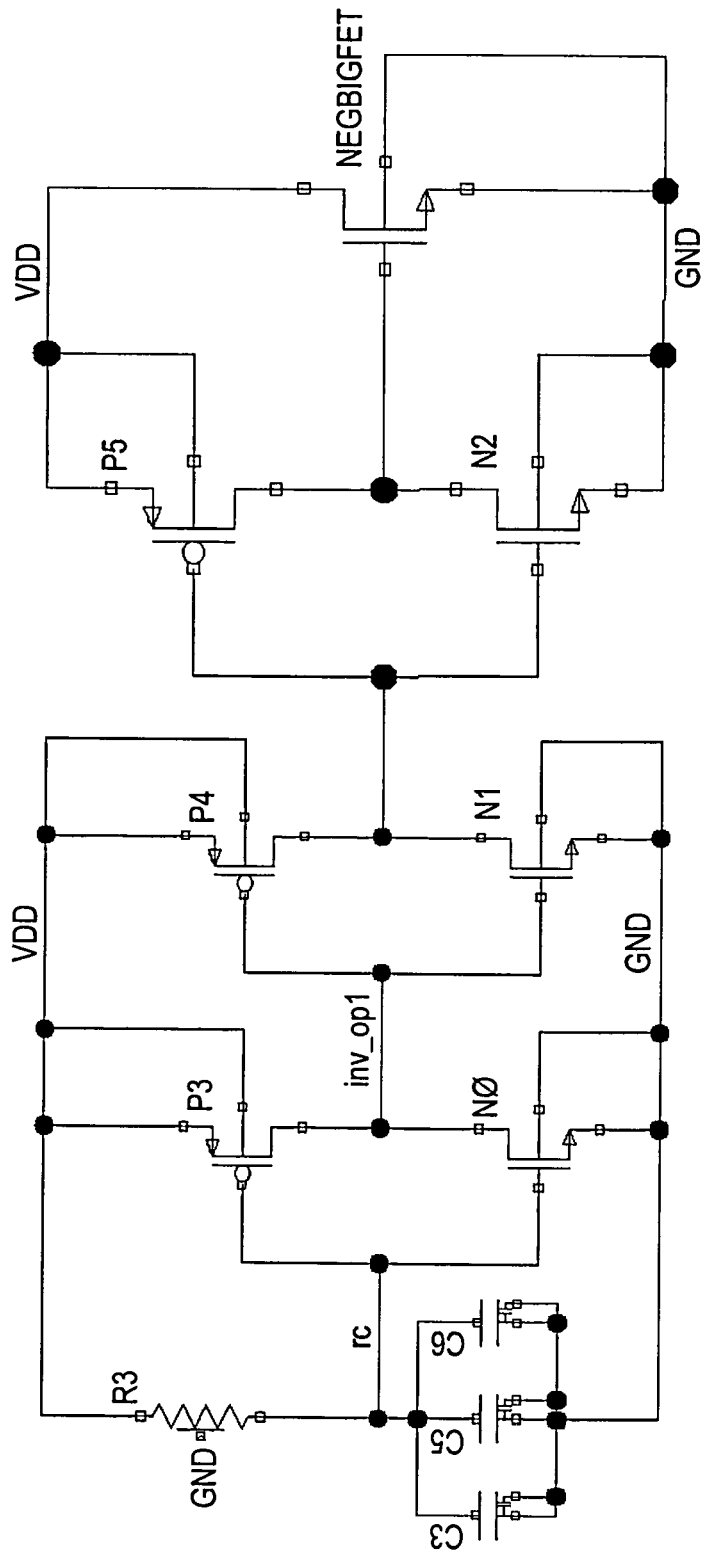
FIGS. 13A to 13C schematically illustrate a layout of an ESD protection circuit in accordance with one embodiment.
Figure 13B:
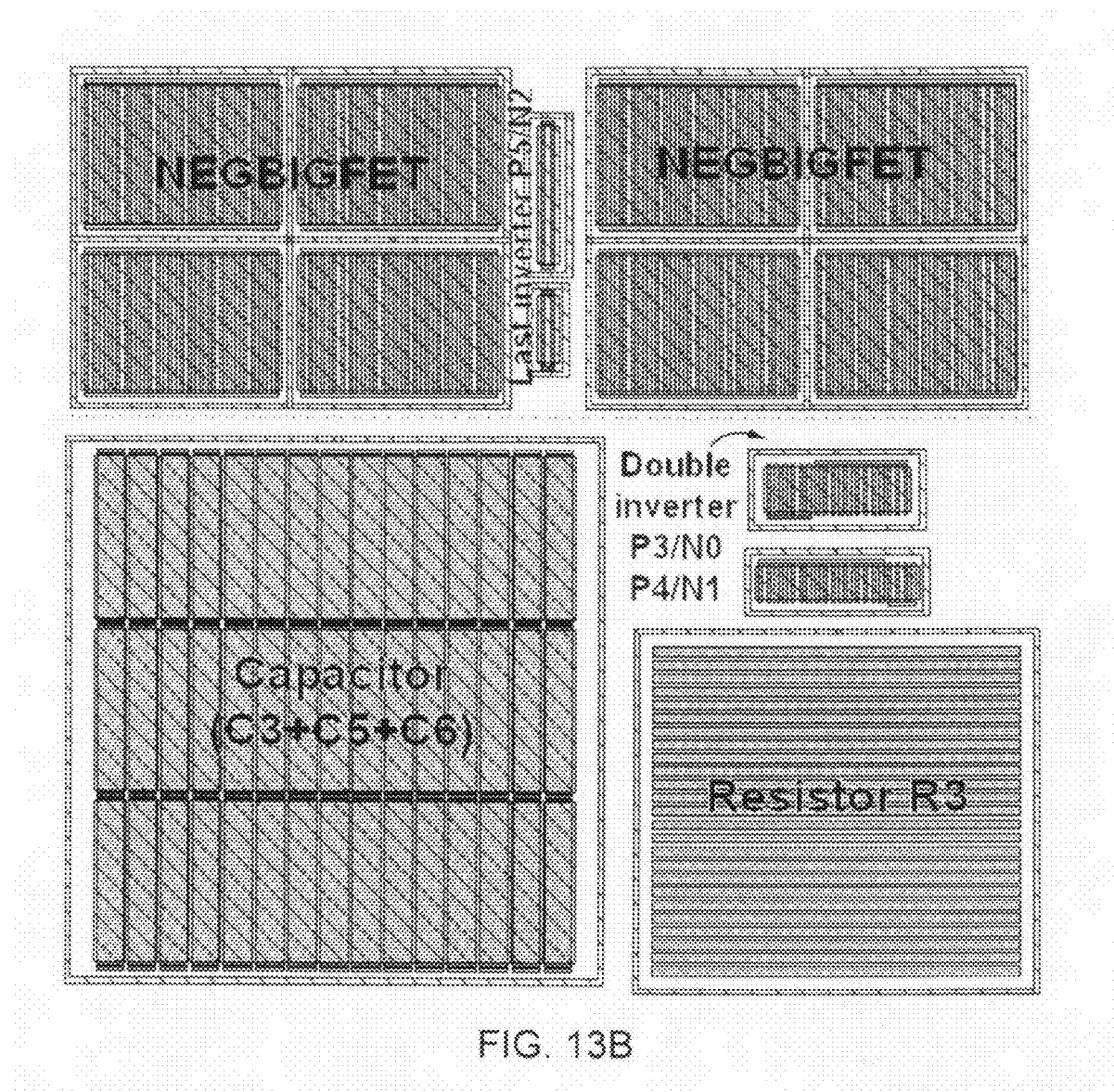
Figure 13C:
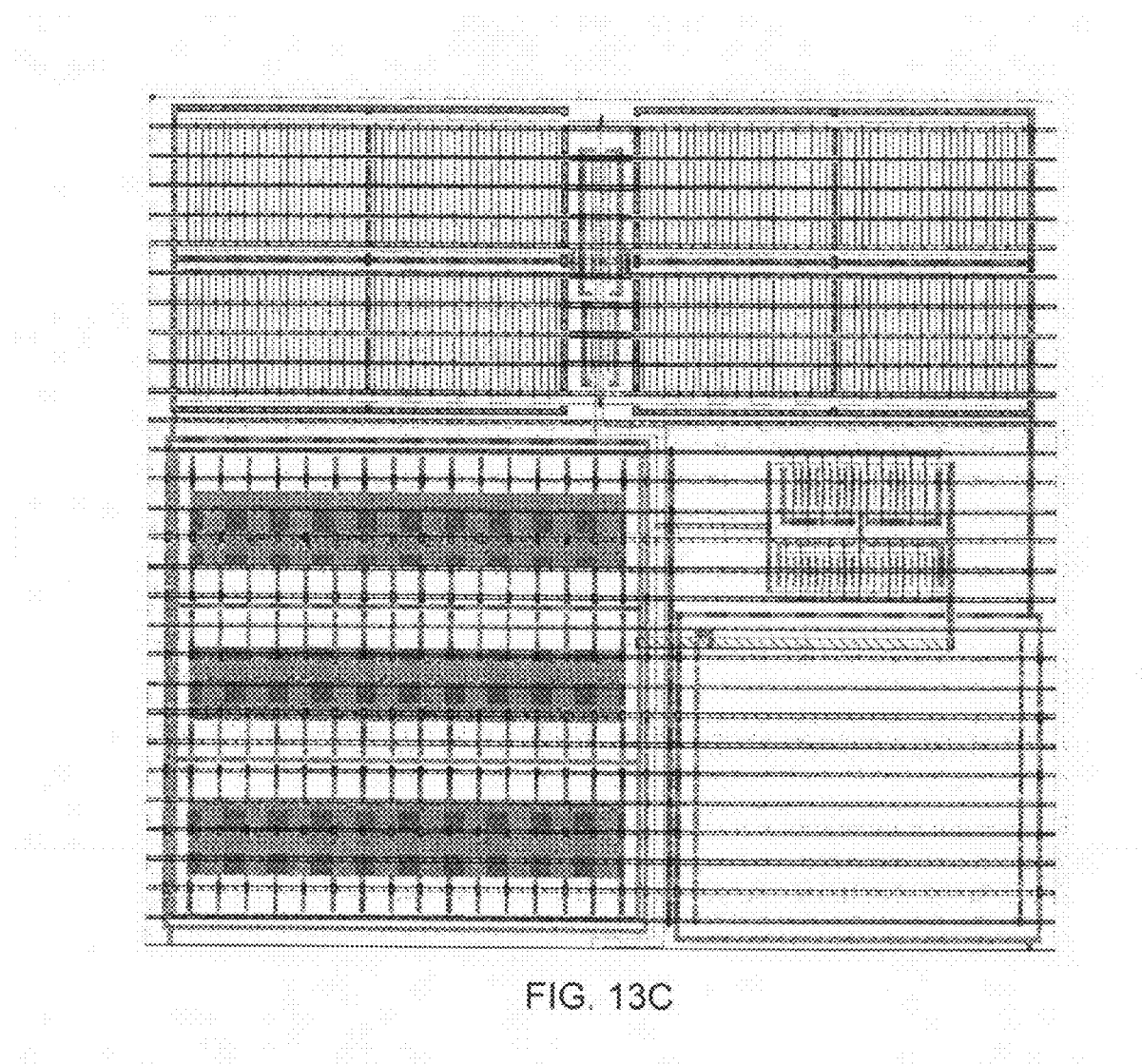

FIG. 13A illustrates one particular embodiment of the ESD clamp that can be used, whilst FIG. 13B and FIG. 13C illustrate how the various components are established within the individual layers of the component level layers 65. In particular, FIG. 13B illustrates the diffusion and poly layers, and the various components have been labelled using the component names used in FIG. 13A. FIG. 13C then shows how the metal 1 and metal 2 layers are used in the formation of each of the components. To avoid obscuring some of the detail, the component names have not been added to FIG. 13C, but the components reside in the same locations as identified in FIG. 13B.

FIGS. 14A to 14C illustrate how the basic design of FIGS. 13A to 13C can be used to establish ESD protection clamps of different sizes. FIG. 14A corresponds directly to FIG. 13B, and shows a single instantiation of the clamp. However, as is shown in FIG. 14B, the portion of the design providing the large FET and the last inverter (formed by the transistors P5 and N2) can be replicated if desired in order to provide a larger clamp. Indeed, as shown in FIG. 14C, multiple instances of the FET, along with an associated last inverter, can be provided if required, whilst leaving the capacitor, resistor and double inverter structures unchanged.

Routing tracks can be provided through the clamp within the area occupied by the capacitor, resistor and double inverters in order to provide a communication channel between functional components provided on either side of the clamp within the functional circuitry.

Hence, it can be seen that the sizing of the ESD clamp can be readily adapted to the needs and implementation constraints. In particular, if a clamp the size of the one shown in FIG. 14C is required, this can be formed as a single structure if the space constraints allow, but if there is insufficient space, two of the structures shown in FIG. 14B can be used to provide the same level of ESD protection, or indeed four instances of the structure of FIG. 14A can be used if necessary.

From the above described embodiments, it will be seen that such embodiments provide a mechanism for providing ESD protection locally within functional circuitry without needing a connection to the peripheral I/O ring. This can be particularly useful in flip-chip implementations, where bump connections can be used to provide power supply connection points to isolated power domains, with the local ESD clamp structure within the functional circuitry being used to provide the required ESD protection. The described approach allows easy and early integration of ESD protection structures, at the only cost of the area required for those structures. The described ESD protection clamp design is fully standard cell compatible, and hence minimises the impact of the integration of such cells within the core functionality of the chip, whilst allowing that integration to take place early in the SoC design phase, for example at the same time as the synthesis.

An optimised layout implementation can be provided that provides enough metal and via quantities to be compatible with the ESD current densities, for example by referring to some ESD specific EM limits. A suitable layout environment is provided for optimised place and route placement. In particular, the metal 2 pitch and shape form factor can be arranged to provide good metal grid compatibility, so to allow all neighbouring standard cells to be properly biased with no EM/IR constraints. The width of the ESD cell can be adjusted to the standard cells pitch in order to allow optimal integration without area losses (since no clearance is needed). In addition, one or more routing channels can be provided through the cells in order to allow a communication path between functional components residing either side of the ESD cell. Furthermore, the design of the ESD cell is constrained so as to not extend beyond the metal 2 layer, hence giving more flexibility to the place and route tool in the overlying layers up to the top metal power grid layers. Additionally, dedicated placement and routing constraints can be established for the ESD cell to allow easy place and route tool automatic placement (to provide no impact on the standard cells in the vicinity of the ESD cell, and to optimise the ESD efficiency).

These features allow easy and early usage of the ESD cell in the SoC design flow (ideally at floor-planning stage), which should alleviate the requirement for late and difficult changes in the design (which has previously often been necessary due to the need for ESD protection being detected very late in the SoC development flow). It has also been found that by providing ESD clamps locally and distributed within the functional circuitry using the techniques of the above described embodiments, it is possible to locally limit the voltage rise under CDM (Charge Device Model) ESD stress conditions, which has traditionally been difficult to achieve when using ESD clamps within the I/O ring only (especially in case of large SoC chips).

Since direct power biasing in the functional circuitry is enabled by flip-chip assembly techniques, and is more and more required in large chips and advanced technologies (with numerous and resistive metal layers) in order to minimise the IR drop and noise sensitivity, the ESD clamp solution of the above described embodiments is likely to be highly useful in many future SoC chip designs. Its full compatibility with the place and route flow and standard cell placement and routing constraints will enable ESD protection to be managed earlier in the SoC development flow providing for more optimal integration.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. An integrated circuit comprising:
functional circuitry comprising functional components configured to perform processing functions required by the integrated circuit; and
interface circuitry configured to provide an interface between the functional circuitry and components external to the integrated circuit;
the integrated circuit being formed of a plurality of layers, said plurality of layers comprising component level layers within which any of said functional components formed from a standard cell are constructed, power grid layers providing a power distribution infrastructure for the functional components, and intervening layers between the power grid layers and the component level layers providing interconnections between the functional components;
the functional circuitry further comprising at least one electrostatic discharge (ESD) protection circuit constructed so as to reside solely within the component level layers to provide ESD protection for an associated one or more of said functional components.

2. An integrated circuit as claimed in claim 1, wherein each said at least one ESD protection circuit is configured to provide at least one communication channel passing through the ESD protection circuit that is not used by the ESD protection circuit, each communication channel providing a communication path between first and second functional components separated by that ESD protection circuit.

3. An integrated circuit as claimed in claim 2, wherein:
the first and second functional components are located within at least one row, and each communication channel is provided by at least one routing track running along that at least one row and passing through the ESD protection circuit.

4. An integrated circuit as claimed in claim 1, wherein said component level layers are provided on a substrate, and include a metal 2 layer forming a top layer of the component level layers most remote from the substrate.

5. An integrated circuit as claimed in claim 1, wherein the functional components are arranged in a plurality of rows, each row having a row height determined by a standard cell pitch, and each said at least one ESD protection circuit being constructed so as to occupy an integer number of said rows.

6. An integrated circuit as claimed in claim 1, wherein the functional circuitry comprises at least one macrocell device formed from multiple of said functional components, the macrocell device extending beyond said component level layers into said intervening layers to provide required interconnections between the functional components of said macrocell.

7. An integrated circuit as claimed in claim 1, wherein multiple power domains are provided within the integrated circuit and said at least one ESD protection circuit is configured to provide ESD protection to said associated one or more functional components within a particular power domain of said multiple power domains.

8. An integrated circuit as claimed in claim 7, wherein said particular power domain has no connection to ESD protection elements provided within the interface circuitry.

9. An integrated circuit as claimed in claim 7, wherein the integrated circuit has a flip-chip implementation providing an array of bump connection points, and power supply for said particular power domain is provided through a number of said bump connection points in said array.

10. An integrated circuit as claimed in claim 9, wherein said number of bump connection points used to provide the power supply for said particular power domain are in a region of the array remote from the interface circuitry.

11. An integrated circuit as claimed in claim 1, wherein each said at least one ESD protection circuit is inserted within the functional circuitry by a place and route tool during a layout phase of a design process for the integrated circuit.

12. An integrated circuit as claimed in claim 11, wherein each said at least one ESD protection circuit is instantiated as a standard cell.

13. A method of providing electrostatic discharge protection for an integrated circuit having functional circuitry comprising functional components for performing the processing functions required by the integrated circuit, and interface circuitry for providing an interface between the functional circuitry and components external to the integrated circuit, the integrated circuit being formed of a plurality of layers, said plurality of layers comprising component level layers within which any of said functional components formed from a standard cell are constructed, power grid layers providing a power distribution infrastructure for the functional components, and intervening layers between the power grid layers and the component level layers providing interconnections between the functional components, the method comprising:
determining the functional components required to perform the processing functions required by the integrated circuit;
identifying groups of functional components requiring electrostatic discharge (ESD) protection; and
for at least one of said identified groups, providing at least one ESD protection circuit within the functional circuitry in association with that group, each said at least one ESD protection circuit constructed so as to reside solely within the component level layers to provide ESD protection for that group.

14. A method as claimed in claim 13, further comprising:
for each identified group, applying predetermined criteria to determine whether to provide the ESD protection for that group using said at least one ESD protection circuit within the functional circuitry or using ESD protection elements within the interface circuitry.

15. A method as claimed in claim 13, wherein the method is performed during a layout phase of a design process for the integrated circuit, and said at least one ESD protection circuit is inserted within the functional circuitry by a place and route tool.

16. An integrated circuit comprising:

functional circuitry means comprising functional component means for performing processing functions required by the integrated circuit; and interface circuitry means for providing an interface between the functional circuitry means and components external to the integrated circuit;

the integrated circuit being formed of a plurality of layers, said plurality of layers comprising component level layers within which any of said functional component means formed from a standard cell are constructed, power grid layers for providing a power distribution infrastructure for the functional component means, and intervening layers between the power grid layers and the component level layers for providing interconnections between the functional component means;

the functional circuitry means further comprising at least one electrostatic discharge (ESD) protection means residing solely within the component level layers for providing ESD protection for an associated one or more of said functional component means.

* * * * *